US009778067B2

(12) United States Patent
Michelutti (10) Patent No.: US 9,778,067 B2
(45) Date of Patent: Oct. 3, 2017

(54) SENSING A PHYSICAL QUANTITY IN RELATION TO A SENSOR (71) Applicant: Infineon Technologies AG, Neubiberg (DE)

(72) Inventor: Alessandro Michelutti, Villach (AT)

(73) Assignee: Infineon Technologies AG, Neubiberg (DE)

( * ) Notice: Subject to any disclaimer, the term of this patent is extended or adjusted under 35 U.S.C. 154(b) by 49 days.

(21) Appl. No.: 14/677,364

(22) Filed: Apr. 2, 2015

(65) Prior Publication Data

US 2016/0290837 A1  Oct. 6, 2016

(51) Int. Cl.
*G01D 18/00* (2006.01)
*G01D 3/028* (2006.01)
*G01D 1/10* (2006.01)
*G01R 31/28* (2006.01)

(52) U.S. Cl.
CPC ............... *G01D 3/028* (2013.01); *G01D 1/10* (2013.01); *G01R 31/2829* (2013.01)

(58) Field of Classification Search
None
See application file for complete search history.

(56) References Cited

U.S. PATENT DOCUMENTS

| 6,346,807 | B1* | 2/2002 | Slates | G01B 7/003 324/207.11 |
| 2007/0295095 | A1* | 12/2007 | Kurtz | G01M 3/3236 73/714 |
| 2013/0033247 | A1* | 2/2013 | Endo | G05F 1/575 323/282 |
| 2013/0076440 | A1* | 3/2013 | Lin | H03F 3/211 330/257 |
| 2013/0342194 | A1 | 12/2013 | Motz et al. | |

* cited by examiner

*Primary Examiner* — Jermele M Hollington
*Assistant Examiner* — Douglas X Rodriguez
(74) *Attorney, Agent, or Firm* — Eschweiler & Potashnik, LLC (57) ABSTRACT A sensor operates to produce a differential signal with a voltage regulated that generates a regulated voltage to a first sensor element for detecting a physical parameter. A current mirror circuit is configured to provide a first sensor current to the first sensor element, detect the first sensor current at the first sensor element and duplicate the detected current to provide a second sensor current to a second sensor element. The second sensor element detects the physical quantity with the replicated current.

25 Claims, 6 Drawing Sheets

SENSING A PHYSICAL QUANTITY IN RELATION TO A SENSOR

FIELD

The present disclosure is in the field of sensors, and more specifically, to sensors that differentially sense a physical quantity.

BACKGROUND

Due to the widespread application of sensors that sense a physical quantity, expectations exist to simplify their manufacturing and implementation to reduce costs associated with these devices, as well as improve functional accuracy. In one example of an application, functional safety in automotive devices is targeted to increase reliability of such devices in terms of their behavior with respect to failures. To achieve corresponding targets in terms of automotive safety integrity level (ASIL) new and enhanced concepts have to be established. To achieve a dedicated ASIL level different target parameters as failures in time (FIT) rate, diagnostic coverage, single point failure mode (SPFM), latent point fault metric (LPFM), etc., have to achieve a dedicated value. For sensors, a typical safety goal is it to ensure dedicated signal accuracy in a predefined time (e.g., 5° deviation of the true angle value being detected in 5 ms at an angle sensor). These applications and others also apply to the need for differentially detecting a physical quantity, in which at least two sensor elements of a sensor are utilized for determining changes in a physical quantity or parameter, such as a rotational speed, rotational direction, a magnetic field, a temperature, a pressure, or other physical parameters, for example.

DETAILED DESCRIPTION

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, an electronic circuit, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors or controllers. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

INTRODUCTION

An introduction of the present disclosure is provided below before detailing various embodiments with reference to example figures. In consideration of the above described deficiencies or needs for sensor systems, various aspects are directed towards a sensor for differentially sensing a physical quantity (or physical parameter) by replicating a current at a first sensor or first sensor element, and providing the replicated current to a second sensor or second sensor element to (differentially) sense the physical quantity. The second sensor element or sensor provided with the replicated current delivers a single-ended, output signal in response to the physical quantity. It is to be noted that the single-ended output signal will contain information about the physical quantity measured at the first sensor element and the second sensor element.

Applications for measuring rotational speed, rotational direction, a magnetic field, a temperature, a pressure, as well as other physical quantities or physical parameters, for example, can operate with differential signals to detect changes in a physical quantity for various system functions, with a continuing demand for improved accuracy, simplicity and quality. In this disclosure magneto-resistive sensors will be explained in detail as a non-limiting example of these applications. A person of ordinary skill will appreciate that various applications of sensors measuring a physical quantity as disclosed can take advantage of measuring the physical quantity (or physical parameter) by replicating a current at a first sensor or first sensor element, and providing the replicated current to a second sensor or second sensor element. As before a single-ended output signal can be provided in response to the physical quantity. The single-ended output signal can contain information about the physical quantity measured at the first sensor element and the second sensor element. A person of ordinary skill will further appreciate that it can be of interest to provide a process-stable voltage to the first sensor, which will help to reduce any impact of process-variations onto the output signal of each one of the sensor elements.

In one embodiment, a sensor system or device being described optimizes an output differential voltage of a differential sensor by utilizing at least two sensors, or elements that are biased to approximately identical currents based on a single bias from a single current supply. An advantage of such a differential sensor is that it doubles the output voltage compared to other differential sensors (e.g., a Wheatstone bridge sensor, or other sensor configured as a bridge circuit), which sense two different states of a physical quantity by relying on a half voltage of a supply voltage, instead of the entire supply voltage range. As such, various applications apply to differentially detecting a physical quantity with a greater range of accuracy, in which at least two sensor elements of a sensor are utilized for determining changes in the physical quantity or parameter.

In another embodiment, the differential sensor being disclosed can sense at least two different states (e.g., polarities, directions, or other property data related to a physical property) of a physical quantity (e.g., rotational speed, rotational direction, a magnetic field, a temperature, a pressure, or other physical quantities or physical parameters) with only one current supply being provided to one sensor or sensor element. Additionally, a second current can be generated from a replication of the first current and provided to the second sensor so that the signal information or sensed data from both sensor elements can be present within one single-ended voltage.

The states of the physical quantity/parameter being detected by the sensor elements can correspond to data that is related to the physical parameter, which is being detected by the corresponding sensor element. For example, a first sensor element can operate to detect a first direction/polarity of a magnetic quantity, while a second sensor element can operate to also detect a second direction/polarity/other state of a magnetic quantity. However, other states or properties can also be detected by different sensor elements for other physical quantities or parameters and referred to as data related to that particular physical quantity. In another example application, an alternating or rotating magnetic field can be caused by a pole wheel as known in the art in order to monitor a rotational movement. Without limitation, the alternating magnetic field can be used in order to monitor a linear movement using a sequence of alternating magnetic poles along the direction of movement. For an alternating or rotating magnetic field, the two sensor elements can sense different magnetic fields, which may be referred to as different (local) states of the physical parameter, namely the rotating or alternating magnetic field. The first and second sensor or sensor element can thus sense different magnetic field values at a given point in time due to a phase shift between the individual sensor signals (sensed data) related to the physical parameter. As an additional application example, an angle sensor can comprise individual sensor elements that are not just displaced, but are further magnetized in a different manner. In the case of an angle sensor, the different magnetizations can cause different magnetic states to be sensed at each of the sensor elements. A person of ordinary skill in the art will readily appreciate that the concept of this disclosure can be used in different applications, such that one or more different states related to a physical quantity (parameter) can be detected by corresponding sensor elements as data related to the physical quantity. Additional aspects and details of the disclosure are further described below with reference to figures.

Figure 1:
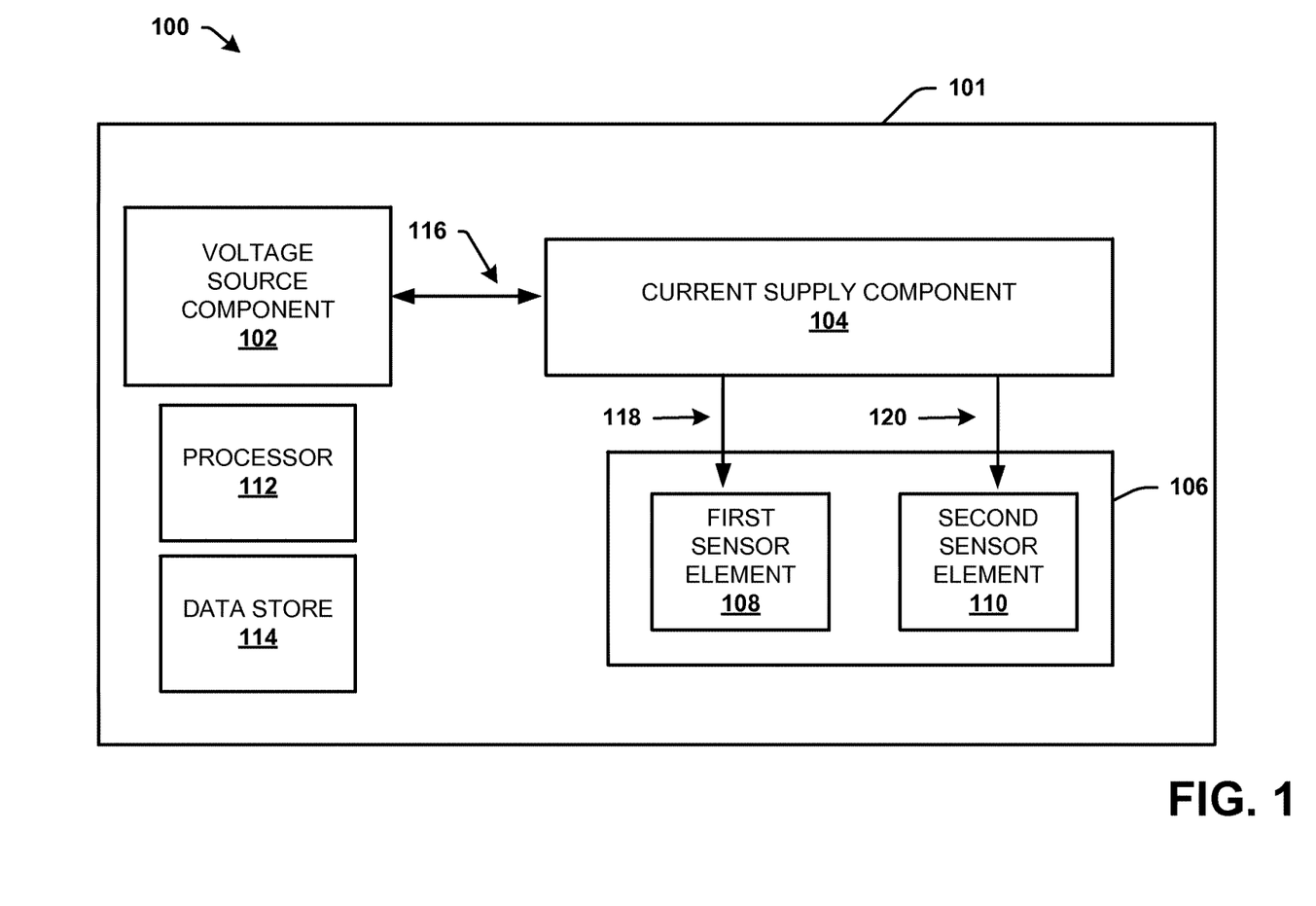
FIG. 1 is a block diagram of a sensor system in accordance with various aspects disclosed.

Examples of (Differentially) Sensing a Physical Quantity in Relation to a Sensor Turning initially to FIG. 1, illustrated is an example high level description of a sensor system 100 that generates sensor data of a physical quantity in accordance with various aspects being disclosed, in which further detailed embodiments are illustrated and described thereafter below. Although FIG. 1 represents a high level example, for ease of description more detailed embodiments are referenced to subsequent figures before turning to the related complete descriptions to the more detailed figures. The system 100, for example, can comprise a sensor device 101, a voltage source component 102, a current supply component 104, a sensor component 106, an optional processor 112 and a further optional data store 114. It can be of interest for the current supply component 104 to be implemented as a component replicating or mirroring the current at the first sensor element 108 to the second sensor element 110. To this end, it may be of further interest to use a process stable voltage to drive the first sensor element 108 in an effort to reduce an impact of process-variations on output signals of the first sensor element 108 or the second sensor element 110. In particular for a single ended signal provided at the second sensor element 110, as was explained above, the process-stable voltage provided at the first sensor element is of interest.

The sensor device 101 can be configured as part of the system 100 on a same chip, semiconductor die, or circuit board, or configured with separate external components. The sensor device 101 can include the sensor component 106 that senses or detects a physical parameter or a quantity of the physical parameter, such as a magnetic field, a resistance change, a pressure, an angle, an orientation, an intensity, a magnitude, a wavelength, a mechanical stress or other physical property or state of a physical quantity/parameter. The sensor device 101 can be included by, utilized in, or a part of, for example, a communication device such as a mobile phone, a personal digital assistant, a computer, a laptop, a vehicle or any other sensing or processing device that operates to detect a change in a property or state of the physical parameter, and ascertain sensor data related to the physical parameter.

The sensor component 106, for example, can operate to differentially detect, or measure data (e.g., sensor information) of a state or property related to a physical parameter via the first sensor element 108 and the second sensor element 110. Although the sensor component 106 is illustrated and described as one sensor with two sensor elements, the sensor component 106 can also be referred to as a sensor device having two sensors as the first sensor element 108 and the second sensor element 110. Each of the sensor elements 108 and 110 can thus be a part of the sensor component 106, and be separate sensors of a same uniform class or type. For example, the sensor component 106 can comprise magnetoresistive sensor or other type of sensor for detecting changes in a magnetic property or state. For example, the sensor component 106 can comprise a tunneling magnetoresistance (TMR), a giant magnetoresistance (GMR) sensor, an extraordinary magnetoresistance (EMR) sensor, a colossal magnetoresistance (CMR) sensor, anisotropic magnetoresistance sensor (AMR), a magneto-elastic transducer, or other resistive sensor type with respective corresponding sensor elements (e.g., Hall elements, AMR elements or the like). The sensor component 106, or sensor elements 108 and 110 can be any number of resistive sensors that operate to detect a change in resistance, in order to sense a magnetic field or a field strength to measure current, position, motion, direction or any other physical property or state of the magnetic field with the sensor elements 108 and 110, or sensor cells from the same class of sensors or transducers (e.g., Hall elements, AMR elements, three dimensional sensor cell elements, pressure sensors, temperature sensors, mechanical transducers, or other like sensing devices).

The sensor device 101 can include the voltage source component 102 that operates to regulate or provide a process stable voltage to the sensor component 106. A "process stable reference voltage" can refer to a voltage supply target for the regulation of and maintaining of a voltage to the first sensor element 108, which ensures the supply voltage is independent from the physical quantity being sensed. In addition, a "process stable voltage" can refer to the voltage provided to the first sensor element 108 as a voltage that is relatively stable over time, over process variations or over component mismatches and is independent of a sensed state as sensed data that is related to the physical quantity.

Figure 2:
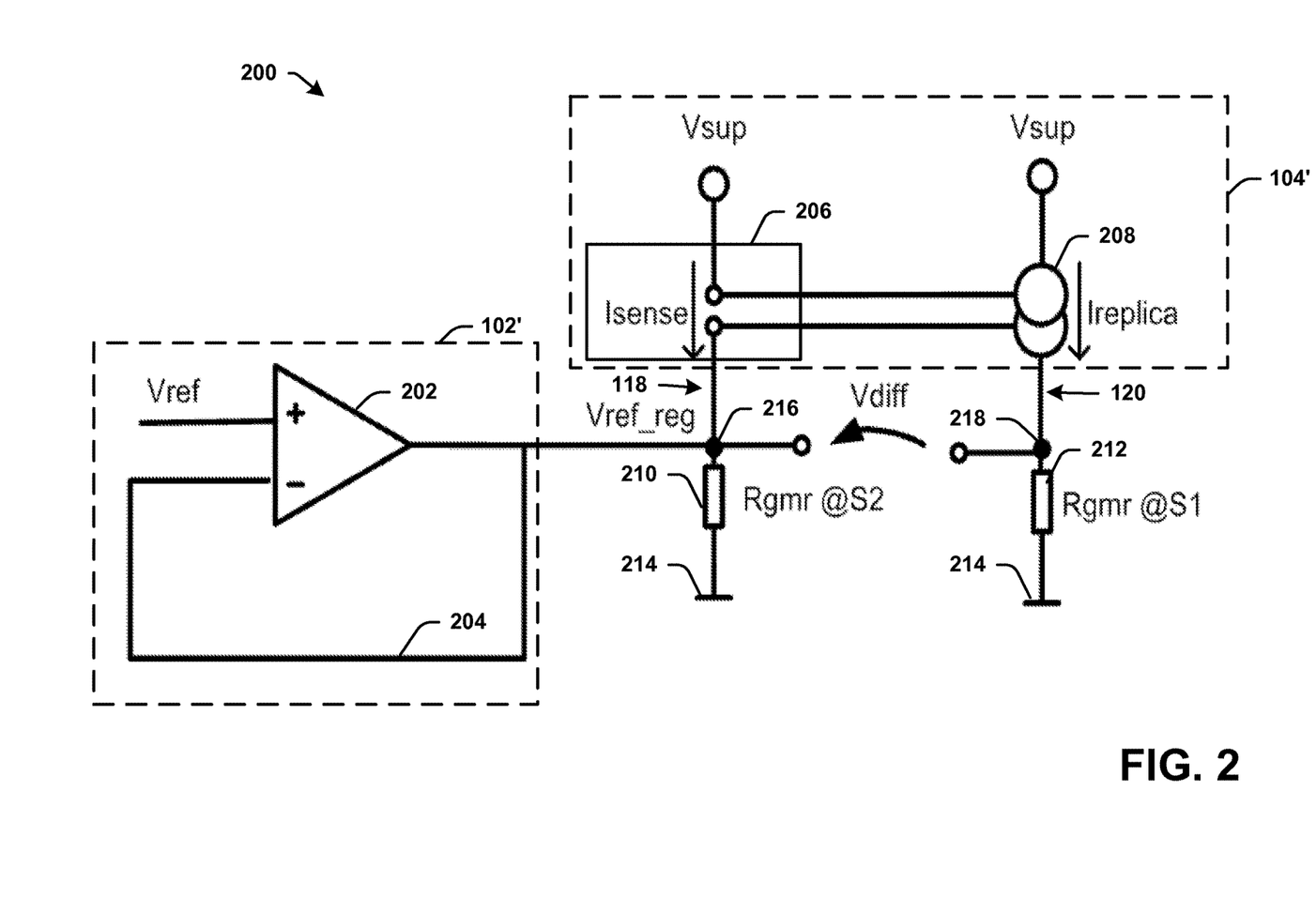
FIG. 2 is another block diagram of a sensor system in accordance with various aspects disclosed.

In one example, the voltage source component 102 can provide a process stable voltage based on a closed-loop configuration, such as a feedback loop or a regulation loop, which is illustrated in more detail by the feedback loop path 204 with reference to FIG. 2, for example, and abstractly illustrated by the communication path 116 in FIG. 1. The voltage source component 102 can generate the process stable voltage based on a process stable reference voltage (e.g., $V_{ref}$ of FIG. 2) via a voltage comparison or a differential minimization that is a function of the process stable reference voltage. In one example, the voltage source component 102 receives a feedback voltage, as abstractly illustrated via a feedback path or loop 116, which can include a portion of the current supply component 104 and the sensor element 108 being configured in a closed-loop configuration to facilitate a feedback voltage.

The voltage source component 102 can comprise an amplifier (e.g., the amplifier 202 of FIG. 2) that is configured to compare a feedback voltage with a process stable reference voltage to stabilize the voltage at the first sensor element 108, and thus facilitate that the voltage at the first sensor element 108 is a process stable voltage, which is independent of the data being detected (sensed data related to the physical quantity). The process stable voltage detected at the first sensor element 108 can thus be maintained based on a minimization of a difference between a feedback voltage and a process stable reference voltage.

Alternatively, the voltage source component 102 can include a bandgap voltage reference circuit (e.g., as further detailed below in FIG. 4 with the voltage source component 102" configured as a bandgap reference circuit), rather than an amplification component (e.g., the amplifier 202 of FIG. 2) in order to directly generate a process stable voltage to the first sensor element 108. During the operation of the first sensor element 108, the current through the first sensor element 108 can change as a result of the detected data (or the sensed information of a corresponding detected state) that is related to the physical quantity or parameter. The voltage source component 102 is configured to provide an amplification gain to the feedback voltage to maintain or adjust the process stable voltage to the first sensor element 108, while the first sensor element 108 independently operates to detect the physical quantity/parameter, sense the state (e.g., a first polarity, a first direction, or other property) of the physical quantity, or, in other words, detect data that is related to the physical quantity.

Figure 4:
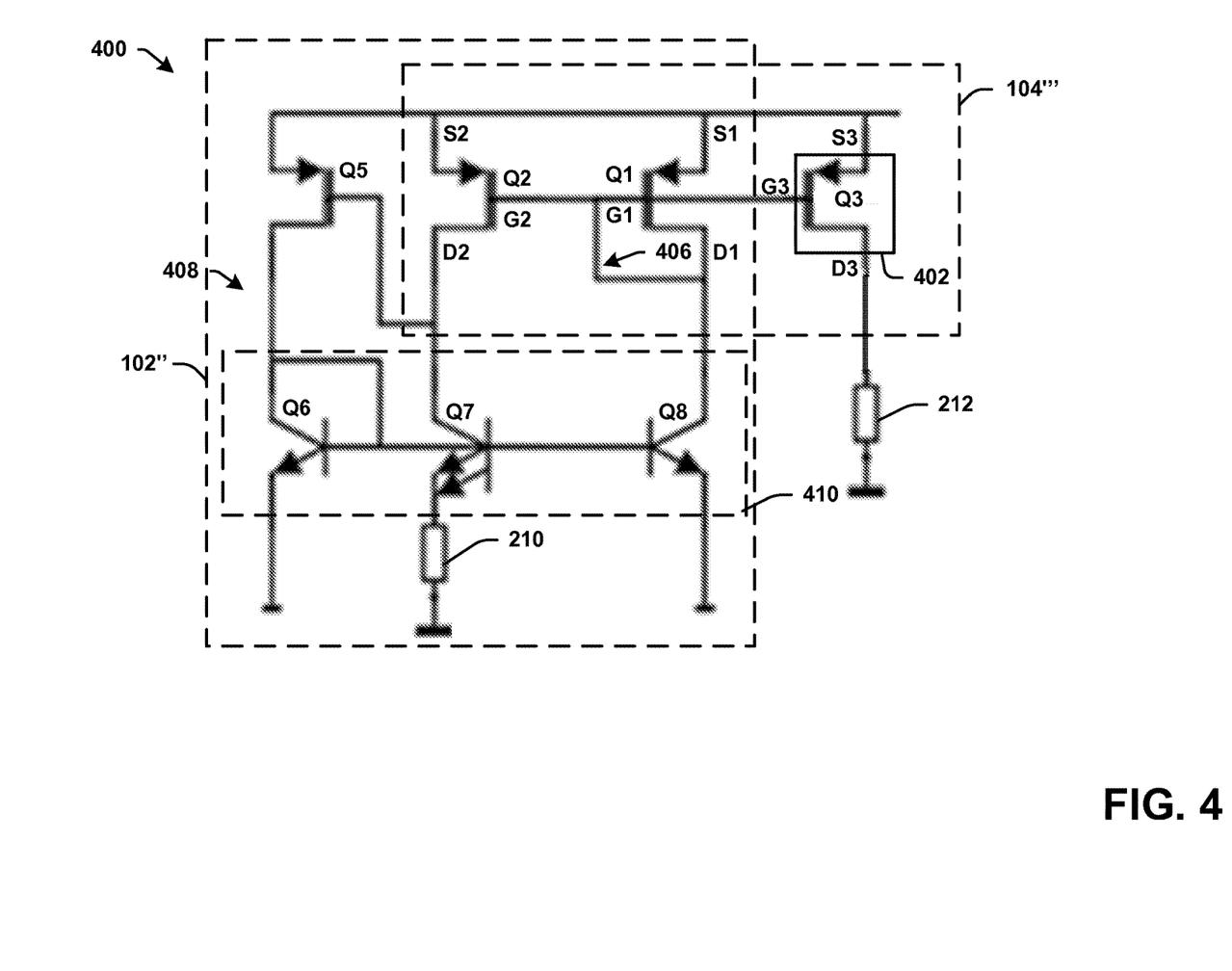
FIG. 4 is another block diagram of a sensor system in accordance with various aspects disclosed.

In addition, the voltage source component 102 can be configured to amplify the voltage with a positive or negative gain to a particular voltage level with one or more transistors (e.g., bipolar transistors or FET transistors 410 of FIG. 4) for providing the process stable voltage directly at the first sensor element 108 (e.g., as a bandgap voltage reference circuit 102" in FIG. 4). The voltage source component 102 regulates the output voltage by controlling a control current to the current supply component 104. The first sensor element 108 receives a biased current from the current supply component 104 to then sense a sensor signal, or sensor data, of a state or property related to the physical parameter (e.g., a magnetic field, a resistance change, or other physical property).

The current supply component 104 is configured to generate one or more supply signals to the first sensor element 108 and the second sensor element 110. The supply of current signals to the first sensor element 108 by the current supply component 104 can be provided by the regulation or feedback loop path 116, which can be based on a closed-loop configuration as further illustrated via the regulation loop or feedback loop path 204 of FIGS. 2 and 3. Thus, at least a part or portion of the current supply component 104 can be coupled to and operates within the regulation/feedback loop path 116, while another part or portion of the current supply component 104 can be formed outside of the regulation/feedback loop 116 for generating a supply signal to the second sensor element 110.

In another embodiment, the current supply component 104 can provide a first supply current to the first sensor element 108 via a supply path 118, and can generate a second supply current to the second sensor element 110 via a supply path 120 based on the first supply current. The second supply current can be based on a predefined function of the first supply current without additional biasing components or current supplies being integrated specific to the second sensor element 110. For example, the current supply component 104 can replicate the first supply current (e.g., via a current mirror circuit), which takes into account the operational conditions, or influences, of the detected state of the physical quantity or parameter at the first sensor element 108 in the generation of the second sensor current to the second sensor element 110 via the supply path 120. It is to be understood that a voltage at a node (e.g., a first node 216 or a second node 218 of FIG. 2) is a single ended voltage. This single ended voltage can comprise information (sensed data) of the physical parameter taken at the first sensor 108 (as a first state at the first node 216) and also information about the physical parameter taken at both, the first sensor 108 and the second sensor 110 (as a second state) due to the operation of the second sensor element 110 using the replicated current from the first sensor element 108. In other words with a replicated current at the second node 216, the single ended signal at node 218 will comprise information about the physical parameter at the first sensor 108 and the second sensor 212 within just one single ended signal.

The single ended voltage can intrinsically reduce or eliminate process, voltage, temperature (PVT) variations, aging variations or other variations inherent in the operation of the sensor component 106. A person of ordinary skill in the art will understand that the single ended voltage can eliminate or reduce the process variations although the current at the first sensor element 108 and the replicated current at the second sensor element 110 are susceptible to named process variations.

In another embodiment, the current supply component 104 can operate with, or as, a current mirror circuit to facilitate the current replication of the current through the first sensor element 108, and further provide the replicated current to the second sensor element 110. For example, the current supply component 104 can include a current sensor (e.g., the current sensor 206 of FIG. 2) that detects the first sensor current. The detected current by the current sensor (e.g., current sensor 206 of FIG. 2) includes the sensor information, or data, of the first physical state related to the physical quantity/parameter with the current at the first sensor element 108. This detected first sensor current is replicated and provided to the second sensor element 110 via the supply path 120. The current supply component 104 thus mirrors, replicates or duplicates the current at the first sensor element 108 and provides the second current though the second sensor element 110 without any additional, or separate, biasing components or current supply device particular to the operation of second sensor element 110; thus, a second current supply may no longer be required. It is to be noted that the currents supplied to the first and second sensor elements 108 and 110 can be an alternating current or a direct current, in which the second current is based on, or is a function of the current at the first sensor element 108 and at least one sensed quantity at the first sensor element 108 acting on or affecting the first current of the first sensor element 108.

The sensor component 106 is thus operable to generate a differential sensor signal that can reflect a changing polarity or state of the physical parameter, such as a change in a magnetic direction, or other parameter, as detected data at the first sensor element 108 and detected data at the second sensor element 110, such as by a change in resistance due to the external state of the physical parameter (e.g., a magnetic field or the other physical parameter). The sensor component 106 can provide one state of a physical parameter (e.g., a magnetic field or magnetic resistance) while biasing only one sensor or sensor element 108 that detects the data of one state and mirroring the current thereat to provide a second current for sensing another state of the physical parameter also. The current supply component 104 generates a second sensor current to the second sensor element 110 from the first signal of the physical parameter detected at the first sensor element 108. As such, the second sensor voltage contains the first sensor signal having sensor information or data (e.g., a polarity, location, magnetization, etc.) related to the physical parameter (e.g., an angle, a magnetic field or other physical parameter) at the first sensor 108, as well as information (data) detected or sensed at the second sensor 110. The sensor information generated by the sensor component 106 with the first and second sensor element can thus comprise a doubling of the detected signal from an external physical parameter, in which both sensor elements 108 and 110 are not in a common mode of operation. Additional details are further provided in further examples below.

Referring to FIG. 2, illustrated is another example of a sensor system in accordance with various aspects being described in further detail. The system 200 can operate to provide a differential signal of different states related to a physical parameter, such as a magnetic field, magnetic states, or other properties (e.g., location, angle, polarity, direction, etc.) of other physical parameters, for example, such as a change in resistance relative to a mechanical stress, a pressure, or the like. The system 200 can be a sensor device or a sensor network comprising two sensor devices, a first sensor 210 and a second sensor 212. Each sensor 210 and 212 can correspond to a sensor element/component or comprise sensor elements/components that detect or sense a change in a state or property of an external physical parameter.

In one example, the sensors 210, 212 are of the same type and comprise magnetoresistive or resistance sensors (e.g., GMR, CMR, AMR, TMR or the like) that alter electrical resistances when an external magnetic field is present. Alternatively, the sensors 210 and 212 can be other types of sensors operating on a same printed circuit board, semiconductor die, or on different printed circuit boards or dies. The system 200 can include the voltage source component 102', the supply component 104', the first sensor 210 and the second sensor 212, for example.

The voltage source component 102' further includes an amplifier 202 that drives a control current for providing a current for generating a process stable voltage ($V_{ref\_reg}$) at the first sensor 210. The amplifier 202 is configured to regulate the process stable voltage ($V_{ref\_reg}$) as a function of a feedback voltage of a feedback loop path 204. The process stable voltage at the first node 216 can then be maintained as a stable and independent voltage despite voltage fluctuations or shifts that can occur at the first sensor 210 (e.g., Rgmr@S2) while detecting variations or changes in an external physical parameter, such as changes in an external magnetic field. In particular, a change in the external magnetic field as the external physical parameter can alter a property of the first sensor 210, such as the electrical resistance of the first sensor 210, which in turn can cause fluctuations in a current provided to the first sensor 210 at the first node 216. The voltage source component 102' can be further configured to regulate the voltage provided at the first node 216 and hence to the first sensor 210 to be a stable voltage supply driving the first sensor 210 for operation without a significant fluctuation in the supplied voltage potential even when fluctuations in the external physical parameter are present.

In one embodiment, the current supply component 104' can comprise a current sensor or sensing component 206 (e.g., a current shunt, current mirror transistor, a magnetic sensor, or other current sensing component) that operates with a supply voltage ($V_{sup}$) and is configured to detect a current (Isense) at the node 216 of the first sensor 210. The detected current at the first sensor 210 can then also be replicated by a replication component 208 (e.g., a current source component, a current mirror circuit, or other current source) of the current supply component 104' based on the process stable voltage. The replication current can further depend on variations of the external physical parameter due to current fluctuations in response thereto, such as the detected signal (e.g., a detected state or property) related to the physical parameter at the first sensor 210.

The replication component 208 (e.g., a current replication component or the like) can be coupled to the current sensor 206, receive the detected current from the current sensing component 206, and can further generate the same current.

In particular, the replication component 208 can provide a duplicated or replicated current as a function of the first sensor 210, more precisely the replicated current as a fluctuating property of the first sensor 210, for example, in response to variations in the external parameter.

This fact may also be formulated mathematically as represented below:

$$V_{218} = \frac{V_{ref\_reg}}{R(1 + S * PQ(S2))} * R(1 + S * PQ(S1))$$
$$= V_{ref\_reg} * [(1 - S * PQ(S2)) * (1 + S * PQ(S1))]$$
$$= \backslash$$
$$= V_{ref\_reg} * (1 + S(PQ(S1) - PQ(S2))$$
$$V_{216} = V_{ref\_reg}$$
$$Vdiff = V_{218} - V_{216}$$
$$= V_{ref\_reg} * S(PQ(S1) - PQ(S2)).$$

Therefore single ended voltage V_218 at the second sensor 212 comprises information from both states, or properties, of the sensed physical parameter at the first and second sensor 210, 212. The single ended voltage V_218 may be expressed as a current multiplied by a resistance, which is then approximated as a Taylor's series as indicated in the above formula. In other words, the single ended voltage V_218. It is to be understood that the single ended voltage V_218 is free from process-variations, because V_ref is process-stable.

A differential voltage reading of V_diff as difference between the voltage V_218 at node 218 and the voltage V_216 conveniently allows for getting rid of any common mode components present in the single ended voltage V_218. A person of ordinary skill will appreciate that the differential voltage V_diff is in fact independent from the resistance R, as can be seen from the above equations. This is to say that the differential voltage V_diff is substantially independent from any sensor process variations impacting the sensor resistivity.

It is to be noted that no additional components operate to bias a second current to the second sensor 212. Rather, current is only biased to the first sensor 210, actively replicated with an active replication component 208 (e.g., an active current mirror device), and then further provided to the second sensor 212 (Rgmr@S1) as a replicated supply signal. The current is conveniently replicated to the second sensor 212, which operates to sense an opposite state or polarity of the physical parameter than sensed at the first sensor 210, for example. The current supply component 104' is thus configured to ensure that any mismatch (e.g., DC component offset, resistive mismatch or other mismatch) between the sensors 210 and 212 is eliminated with respect to any process, voltage, temperature or aging variations between the two sensors 210 and 212. In addition, the sensors 210 and 212 can be coupled to a reference potential, such as ground 214.

While the first sensor 210 can be supplied with the process stable voltage to detect a first state of the physical parameter (e.g., a magnetic field or change in a resistance in response to a magnetic field state/polarity), the second sensor 212 can detect a second state (e.g., opposite polarity) of the physical parameter that is different from the first state. The second sensor 212 is thus configured to detect a signal in response to the physical quantity as a function of the replicated current of the first sensor 210 and the second state of the physical parameter. The second sensor 212 detects and provides a signal having the first state and the second state of the physical parameter, which may thereby be measured.

The sensor system 200 can further operate to generate a voltage differential that senses the different states of an external physical parameter, in the case of a resistive or a magnetoresistive sensor, for example, from different states of the physical parameter with two sensors and a single current supply bias to the first sensor. For example, the voltage differential Vdiff can be approximately expressed as:

$$V_{diff} = V_{ref\_reg} * S * (B_2 - B_1),$$

in which B1 represents a magnetic field present at a given instant at the first sensor 210, B2 represents the magnetic field at the given instant at the second sensor element 212, S represents the sensitivity of the sensors 210 and 212. In this case, if the sensitivity S of the sensors is not identical a sensitivity mismatched between the first and second sensors 210 and 212 can be present. Because the replication component 208 can provide a duplicated or replicated current as a function of the first sensor 210, the second sensor 212 enables information from both sensors 210 and 212 related to the properties of the physical parameter to present at a single-ended voltage. In the previous equations PQ(S1) corresponds to B_1 and PQ(S2) corresponds to B_2. Therefore again, there are no process-variations affecting the differential voltage.

Figure 3:
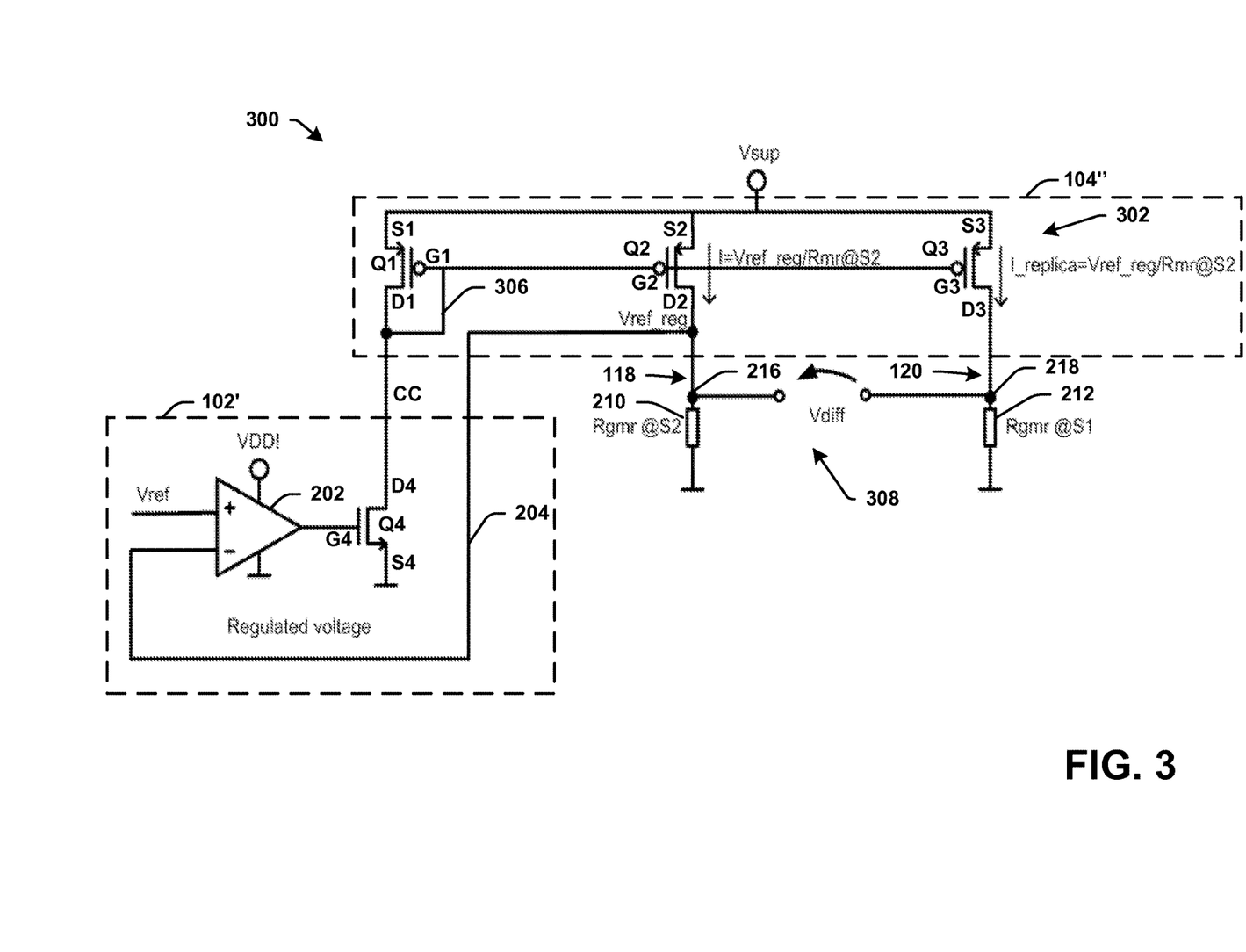
FIG. 3 is another block diagram of a sensor system in accordance with various aspects disclosed.

Referring to FIG. 3, illustrated is another example of a sensor system 300 for differentially sensing an external physical parameter in accordance with various aspects. The sensor system 300 comprises similar components as discussed above, as well as example embodiments of the current supply component 104".

The current supply component 104" further comprises a current mirror circuit 302, which operates to provide the first sensor 210 with a supply signal output 118 comprising a supply voltage. The supply signal 118 to the first sensor 108 can be controlled as a process stable voltage by the supply circuit 104" in a closed-loop configuration via the feedback loop path 204, which, for example, could also be configured as a feedback loop. The current supply component 104" can operate to detect the current signal provided to the first node 216, which can be a function of the resistance of the first sensor 210 and the process stable voltage (Vref_reg). In response to the detected first sensor current through the first sensor 210, the current supply component 104" can operate further to generate a second sensor current to the second sensor 212 as a function of the first current without additional biasing components.

For example, the current mirror circuit 302 generates the first sensor current to the first sensor 210, and without any other additional current supply, the current present at the first sensor 210 along with (or in addition to) data (or sensed information) of a property or state (e.g., a magnetic state, magnetic magnitude, magnetic direction, or the like) related to a physical quantity (e.g., a magnetic field) is detected and replicated. This replicated current comprises sensor data therein that is related to the physical quantity, which can then be provided to the second sensor element 212 as the second sensor current. The voltage or current signal taken from a single ended voltage terminal or a second node 218, for example, of the second sensor 212 thus fulfills a predetermined relationship with the first sensor supply current, such as by the replication or duplication of the first sensor current based on the voltage supplied thereat (Vref_reg process stable voltage) and the data sensed in a first state of the physical quantity. The second supply current can then be provided by the current supply component 104" via a second output 120 and can be proportional to the magnitude of the current detected at the first sensor 210.

In the above manner, the current supply component 104" operates to eliminate a process variation, such as a temperature, voltage, or device variation or offset among the sensors 210 and 212. By generating a differential sensor signal that is based on a differential between a first voltage signal in response to a detected first state of the physical parameter and a second voltage signal in response to a detected second state, the current supply component 104" can eliminate, reject or reduce process variations within the sensor system 300. The difference between the process stable voltage and the voltage across the second sensor, for example, is proportional to the difference of the physical quantity or the physical parameter at the two states, and thus the sensor system 300 with the current supply component 104" operates to reject, cancel or prevent any dependency on other undesired physical quantities or process variations.

In one aspect of an embodiment, the sensor system 300 can be configured to eliminate a process variation by generating the differential sensor signal ($V_{diff}$) based on a proportional relation to the process stable voltage ($V_{ref}$), and based on the first signal provided by the first sensor 210 and the second signal provided by the second sensor 212 to a differential output 308. The level of the reference voltage ($V_{ref}$) can be a design parameter that has a magnitude relative to the supply voltage ($V_{sup}$) of the current supply component 104". The sensor system 300 can further take into account or factor in the saturation voltage ($V_{DSAT}$) of the current mirror circuit 302 and a half dynamic range ($V_{Half\_FS}$) of the first sensor 210 or the second sensor 212, which can vary depending on the type of sensor being utilized. The feedback voltage from the first node 216 via the feedback path 204 can be configured considering the saturation voltage ($V_{DSAT}$) of the current mirror circuit 302 (e.g., $V_{SUP}-V_{node\ 210}>V_{DSAT}$), while the voltage across the second sensor 212 can be configured to not exceed $V_{SUP}-(V_{DSAT}-V_{Half\_FS})$, in which $V_{HALF\_FS}$ represents half of the dynamic range of the voltage utilized by the sensor 210 or 212 and $V_{SUP}$ represents a supply voltage to the current mirror circuit 302. As such, an output voltage can be doubled relative to sensors having a bridge circuit (e.g., a Wheatstone bridge circuit, or the like). The $V_{diff}$, for example, can approximately be expressed as follows: $V_{diff}=(V_{SUP}-(V_{DSAT}-V_{Half\_FS})*S(PQ(Sensor2)-PQ(Sensor1)$, where PQ represents the physical quantity, or data detected at each corresponding sensor related to the physical quantity (e.g., a magnetic field, a magnetic state, a polarity, a direction, an angle, a magnitude, or the like). In addition, a single bias current can be provided at the current supply component 104" without requirements for additional calibrations to eliminate process variations (e.g., temperature variations) in sensing two different states of a physical parameter or quantity. As shown in the above equation, the voltage differential $V_{diff}$ between the first node 216 and the second node 218 can be expressed with the elimination of any particular mismatch that occurs between the sensors 210 and 212.

The current mirror circuit 302 can further include a first transistor Q1 configured as a current mirror input that is configured to receive a control current input from the voltage source component 102'. A second transistor Q2 is coupled to the first transistor Q1 at control terminals G1 and G2 (e.g., gate contacts) respectively. The second transistor Q2 is configured as a first current mirror output, in order to generate the first sensor current to the first sensor 210 via a first supply terminal D2 and the supply output 118 according to a current signal from the first transistor Q1. A third transistor Q3 is further coupled to the second transistor Q2 and the first transistor Q1 at the control terminals G1, G2 and G3. The third transistor Q3 is configured as a second current mirror output component, in order to replicate the first sensor current and provide a replicated current as the second sensor current to the second sensor via a second supply terminal 120.

The first transistor Q1 comprises a first input contact S1 (e.g., a source contact), the first control contact G1, and a first output contact D1 (e.g., a drain contact). The second transistor Q2 comprises a second input contact S2, the second control contact G2, and a second output contact D2. The third transistor Q3 comprises a third input contact S3, the third control contact G3 and a third output contact D3. The first input contact S1, the second input contact S2 and the third input contact S3 of each of the three transistors Q1, Q2, and Q3 are coupled to one another and to a voltage supply terminal to receive a supply voltage $V_{sup}$.

In addition, the first output contact D1 of Q1 is coupled to the voltage source component 102'. The first output contact D1 as a drain terminal of the first transistor Q1, for example, is also coupled to the control contacts G1, G2, and G3 via a feedback path 306 to form an input of the current mirror 302 and a mechanism for control via a control current from the voltage source component 102'. Further, the second output contact D2 is coupled to the first sensor 210, and the third output contact D3 is coupled to the second sensor 212 via a second node 218, which respectively provide the first current and the second current based on a replication of the first current.

To facilitate the operations of the sensor system 300, the transistors Q1, Q2 and Q3 of the current mirror circuit 302 are p-channel metal oxide semiconductor field-effect transistors (MOSFETs), but could also be n-channel MOSFETs or other FET transistors as being within the scope of this disclosure. When a current is provided into the input branch of the current mirror 302 or, in other words, fed through the first transistor Q1, the current mirror 302 replicates a proportional current in both the second and third transistors Q2, Q3. The proportionality is essentially determined by the layout of the second transistor Q2 with respect to the first transistor Q1 and of the third transistor Q3 with respect to the first transistor Q1. For instance, in the case of a MOSFET-implementation, channel width of the respective transistor Q1, Q2, Q3 and ratios based thereon can determine or at least partially influence the proportionality factors of the current mirror circuit 302.

The current supply component 104" operates based on the generation of a control current CC flowing through the first transistor Q1 and a fourth transistor Q4, coupled in between the first transistor Q1 and a reference potential, or a ground. As such, a source contact S4 of the fourth transistor Q4 is coupled to a ground terminal for the reference potential; while a fourth drain contact of the fourth transistor Q4 is coupled to a drain terminal D4 of the first transistor Q1. A gate terminal G4 of the fourth transistor Q4 is coupled to an output of an operational amplifier 202. A non-inverting input of the operational amplifier 202 is provided with a reference voltage or a process stable reference voltage, which can be indicative of or in proportion to the supply voltage of the supply signal $V_{sup}$. An inverting input of the operational amplifier is coupled to the first node 216 coupled in between the output 118 of the current supply circuit 104" and the first sensor 210 via the feedback loop or path 204.

The electrical connection between the first node 216 and the inverting input of the operational amplifier 202 forms the feedback loop or path 204 to provide a feedback/regulated voltage from the first node 216 to the operational amplifier 202. Due to the feedback path 204, the voltage source component 102' operates in a closed-loop configuration. The feedback path 204 includes the voltage source component 102' with the amplifier 202, the fourth transistor Q4, the first transistor Q1, and the second transistor Q2. The feedback path 204 operates to provide a supply voltage to the first current sensor 210, in which the current mirror circuit is at least partially within, or a part of, the feedback loop as the feedback path 204, while also being at least partially outside of, or external to, the feedback path 204, such as at transistor Q3.

The current of Q1 as well as the currents flowing through the second and third transistors Q2, Q3 have a magnitude that depends on the physical quantity sensed by the sensor 210. As such, the information related to sensor 210 is contained in the currents of Q1 through Q3, while information related to the sensor 212 is contained in the resistor information of the sensor. Therefore, the voltage across 212 is proportional to the difference of the two physical states or properties of a physical quantity (e.g., a magnetic field or the like) sensed respectively by sensors 210 and 212. As the voltage across 212 exhibits a DC component, for example, a second voltage, i.e., $V_{ref\_reg}$, can be selected to get rid of the mentioned DC component, by processing the two voltages in a differential manner.

As stated above, the current supply component 104" can be integrated as partially inside of the feedback loop path 204, in a closed loop configuration with the voltage source component 102', and as partially outside of the feedback loop 204 with at least the transistor Q3. Based on the control current CC flowing through the first transistor Q1 and thus through the input path of the current mirror circuit 302, the supply current of the supply signal via the first supply output path 118 comprises a magnitude which is based on—via the previously-outlined proportionality factor of the transistors Q1 and Q2 involved—the magnitude of the control current CC, while the process stable voltage (Vref_reg) is controlled by the voltage source component 102' comprising the feedback loop or path 204. In addition, the second current via the second current mirror output 120 is also provided by the current supply component 104" and its current mirror circuit 302 in response to the control current CC based on the proportionality factor at least partially determined by the transistors Q1 and Q3. In addition, it is to be noted that the sensing voltage of the further supply signal provided via the second output 120 is not controlled so that the second sensor element 212 is operated in an open loop mode or configuration outside of the feedback path 204, which is formed by the voltage source component 102', and the transistors Q4, Q1, and Q2. As such, only one current supply is required to the sensor system 300 while more than one supply currents that are derived from a replication or duplication of the one current supply.

Referring now to FIG. 4, illustrated is another example of a sensor system having a bandgap reference circuit in accordance with various aspects being described. The sensor system 400 includes similar components as discussed above, including the first and second sensors 210 and 212, the voltage source component 102", and the current supply component 104'".

The current supply component 104'" comprises a current replicating component 402 that provides a replicated current to the second sensor 212 based on a first current being detected at the first sensor 210. For example, replicating component 402 can include the transistor Q3 having an input contact S3, a gate contact G3 and an output contact D3. The current supply component 104'" operates as a current mirror circuit with current mirror components similar to the current supply component 104" discussed above in FIG. 3. The current mirror circuit of the current supply component 104'" includes the transistors Q1, Q2, and Q3, which are arranged as a current mirror input Q1, a current mirror output Q2, and the replicating component 402 coupled together at gate contacts G1, G2 and G3.

The current supply component 104'" generates a current proportional to the second sensor 212 from a detection of the first sensor current at the first sensor 210. The transistor Q1 operates as an input control to the current supply component 104'" via an input control path 406 connecting the gate contact G1 of the transistor Q1 to the drain contact D1. The current at the first sensor 210 is detected by the current supply component 104'". The transistor Q5 operates as an input control transistor to the current supply component 104'" and to the voltage source component 102", similar to the transistor Q4 of FIG. 3.

In one embodiment, the voltage source component 102" can be designed as a bandgap voltage reference circuit to directly provide the process stable voltage to the first sensor 210 with bipolar transistors 410 (Q6, Q7, and Q8). The voltage source component 102" as a bandgap voltage reference circuit includes the bipolar transistors 410, which forms a regulation loop 408 with the transistors Q1, Q2 and Q5, and also includes the transistors Q1, Q2 and Q5, and the sensor 210. The regulation loop 408 provides the process stable voltage directly to the first sensor 210 for sensing operation of a first state (property) of the physical parameter (e.g., a magnetic field or other external physical quantity/parameter).

During the operation of the first sensor 210, the current through the first sensor 210 can change (or fluctuate) as a result of the detected data (or sensor information) of the sensed first state (property) related to a first state of an external physical quantity or parameter (e.g., a magnetic field or other external physical quantity/parameter). The voltage source component 102" provides a process stable (reference) voltage with an amplification gain from the feedback voltage within a regulation loop 408, which is formed by the bipolar transistors Q6, Q7, and Q8 with the current supply component 104'". The regulation loop 408 maintains or generates a process stable voltage to the first sensor 210, while the first sensor 210 detects the first state (property) of the physical parameter. The current supply component 104'" operates to detect the current at the first sensor 210 along with the sensor information (or data) related to the physical parameter as a part of (or within) the regulation loop 408. The current supply component 104'" can further replicate the first sensor current with the replication component 402, which is located outside of the regulation loop 408. The replicated current to the second sensor 212 can be based on the process stable voltage to the first sensor current 210 and also the detected first state (or sensed information) of the physical parameter. The second sensor 212 thus senses or detects a second state of the physical parameter without any additionally biasing or biasing components thereto, but rather from a replicated current having the sensor information or data of the first state related to the physical parameter. The embodiments and aspects disclosed are illustrated as an alternative to having a process stable reference voltage ($V_{ref}$) and the amplifier 202 of FIG. 3. Therefore, a process stable voltage is applied as a regulated direct voltage without any minimization or comparison occurring via the amplifier 202, for example.

Figure 5:
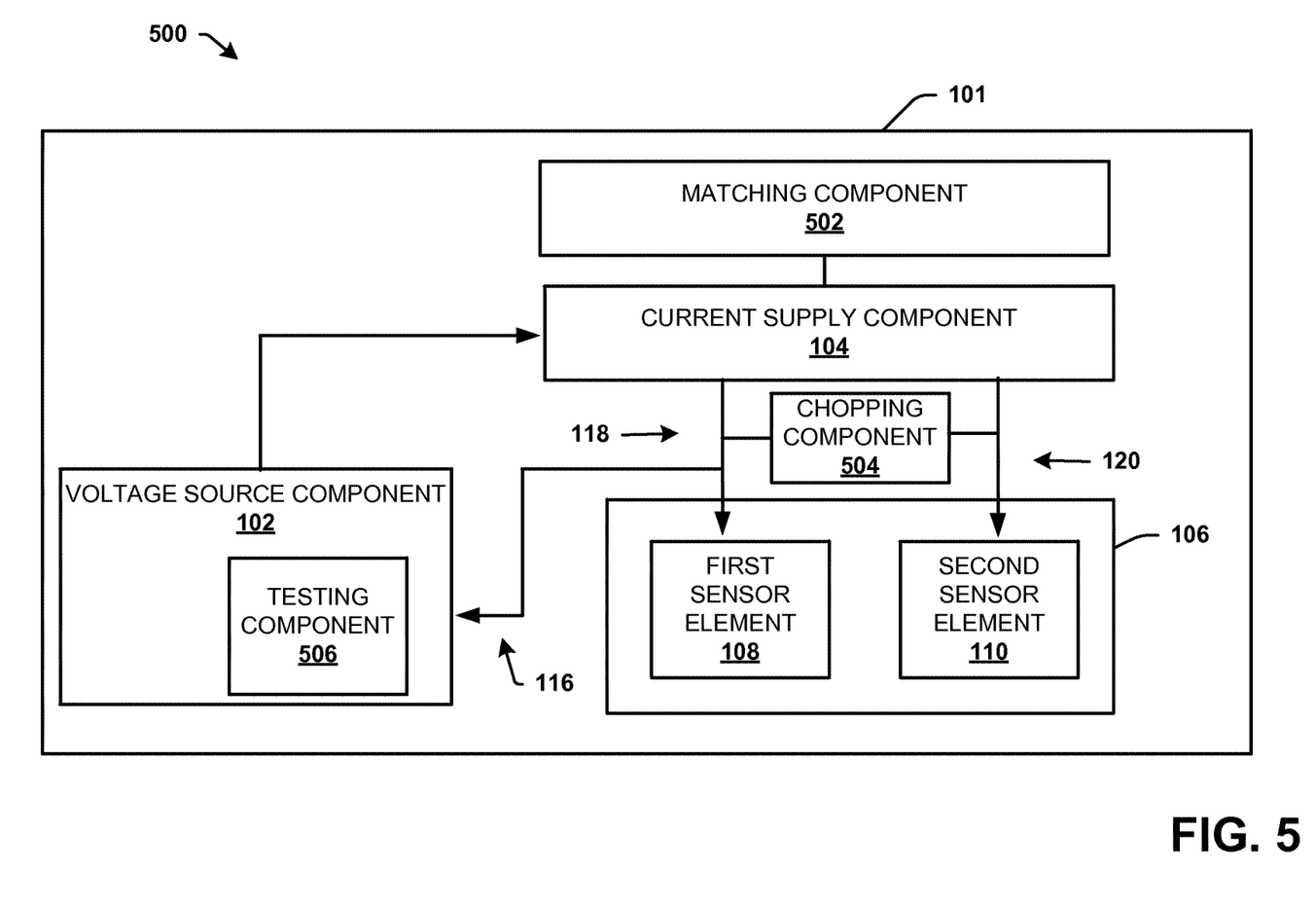
FIG. 5 is a block diagram of a sensor system in accordance with various aspects disclosed.

Referring to FIG. 5, illustrated is another example embodiment of a sensor system in accordance with various aspects. The system 500 comprises similar components discussed supra, and further includes one example configuration of a matching component 502, a chopping component 504, and a testing component 506.

The matching component 502 can operate to reduce or eliminate an electrical offset or mismatch resulting from a resistive mismatch between the first sensor element 108 and the second sensor element 110, for example. The matching component 502 can activate or deactivate one or more current mirror components that are configured to replicate the first sensor current at the first sensor element 108 and provide a replicated current to the second sensor element 110. The second sensor current to the second sensor element 110 can thus be initially calibrated or dynamically adjusted to eliminate resistive mismatches.

In one example, the matching component 502 can activate or deactivate segments of the current mirror output component, a current mirror transistor, or other current replicating components of the current supply component 104, in order to eliminate a resistive mismatch or other mismatch. The matching component 502, for example, dynamically modifies, activates or couples a number of current mirror circuits (not shown) or current mirror components with the current supply component 104, in response to a resistive mismatch resulting from process variations. For example, the matching component 502 can comprise additional segments such as transistors, current mirror circuits or other components to selectively couple or activate a number of additional components to the current supply component 104, which can alter a total width of the current supply component 104, the current mirror circuit or transistor components of the circuit. In other words, the matching component 502 can be programmable to eliminate a mismatch, or an offset, by selecting or activating the number of segments to be coupled to the current supply component 104, or component(s) thereof. The selected segments can be coupled together (e.g., in a series connection, a parallel connection or other configuration). The matching component 502 thus operates to trim a differential voltage between the first sensor element 108 and the second sensor element 110 to obtain an approximately zero voltage difference when no external physical parameter or quantity (e.g., a magnetic state or stimuli) is present, thus ensuring an approximately equal or constant resistance and eliminating a resistive mismatch, for example.

The chopping component 504 can include a chopper or chopping circuit that operates to chop the outputs of the current supply component 104 in order to eliminate or reduce a frequency noise. In particular, the current supply component 104 can include one or more active devices forming a current mirror. Any frequency noise resulting from the operation of the current supply component 104 can be eliminated or canceled via the chopping component 504. For example, the chopping component 504 cab configured to chop an output via the first supply path 118 with the second supply path 120. In another example, an output contact or drain of the second transistor Q2 can be swapped, or chopped, with another output contact (drain contact) of the third transistor Q3 to reduce a low frequency noise.

The testing component 506 can be configured to individually and independently generate a test of a sensor parameter (e.g., a resistance, a membrane area, a distance, a height of a membrane, a spring constant, a pressure, or other parameter related to a sensor function, such as a permittivity constant ($\epsilon$), a coefficient of expansion, a material coefficient like the Young's modulus or other relevant parameters to sensing a physical parameter, property or quantity by a sensor). The testing of the first sensor element 108 and the second sensor element 110 can be done in isolation from one another by generating an open loop configuration to deactivate the feedback or regulation loop 116 and the voltage source component 102 via one or more switches (not shown). The testing component 506 is configured to independently provide a current (e.g., a test current or other independent current) to the first sensor element 108 and the second sensor element 110 via the current supply component 104. The testing component 506 or another component coupled thereto can operate to independently calibrate the tested sensor parameter of the first sensor element 108 or the second sensor element 110 based on the test or one or more target values.

The testing component 506 can further comprise one or more power down switches configured to deactivate the current supply component, and then provide an external test current to the first and second sensor to measure the voltage directly at first or the second sensor element 108, 110. The sensor system 500 can then function in order to characterize a resistive behavior of the sensors, or to evaluate the sensors parameters such as a function of the measured resistance of each sensor or sensor element. A sensor parameter, for example, can be a sensitivity (S), a resistance, a tolerance, or other characteristic related to the fabrication or design of the sensor or sensor element, for example.

In one example, the testing component 506 can facilitate the regulation or feedback loop (e.g., 116, 204 or 408 of FIGS. 1-4) into an open loop configuration by deactivating the current supply component 104, for example, via one or more switches, such as power down switch(es) (not shown), which can be coupled to independently test the first sensor element 108 and the second sensor element 110. A current can be applied to the first sensor element 108 or the second sensor element 110 via the current mirror circuit or the current supply component 104, via an external provided current, or via a testing current supplied via the testing component 506. The testing component 506 can perform a determination of a sensor parameter of at least one of the sensor elements and modify the sensor parameter based on the determination.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 6:
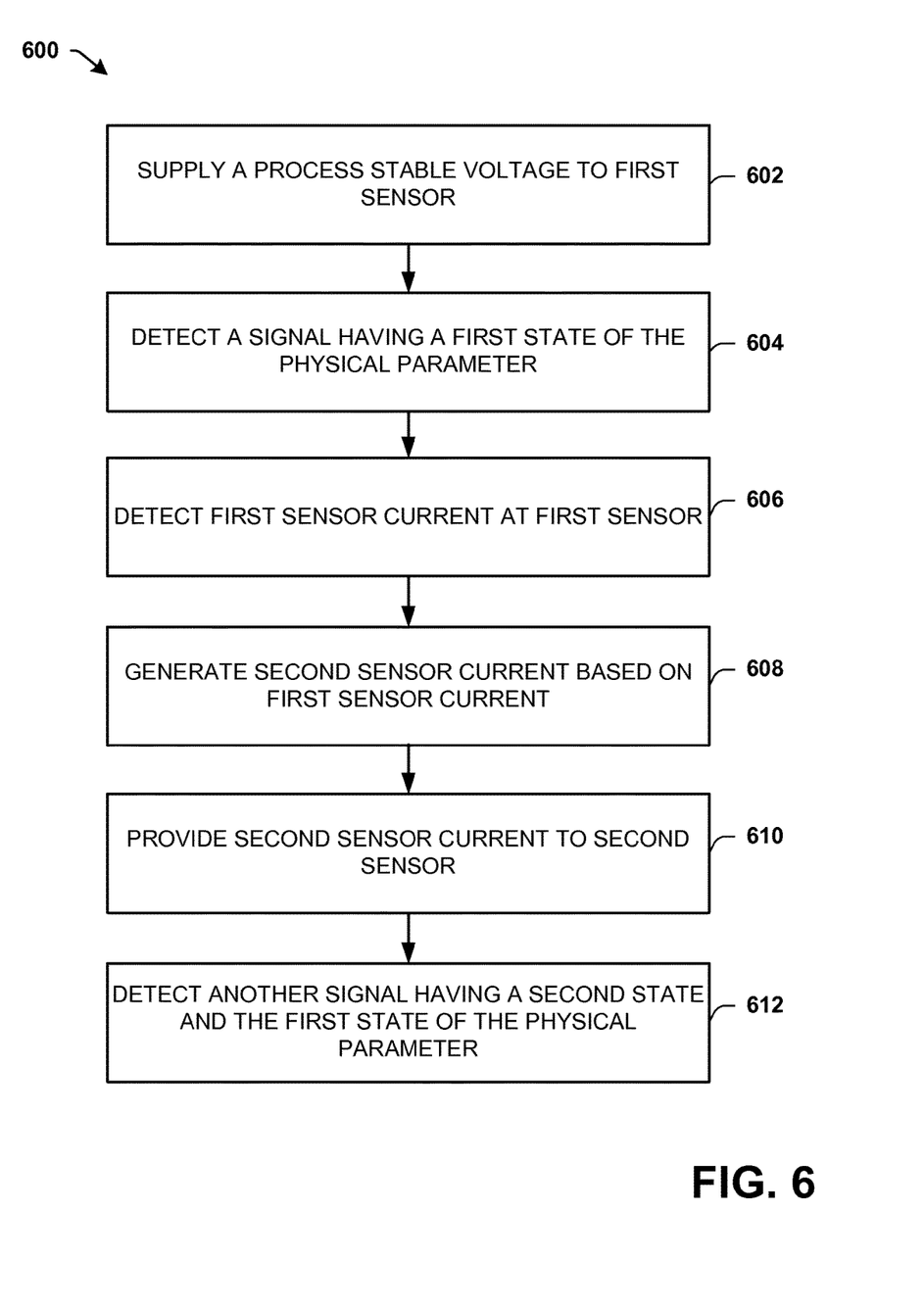
FIG. 6 is a process flow of a sensor system in accordance with various aspects disclosed.

Referring to FIG. 6, illustrated is a method 600 for sensor interface systems in accordance with aspects disclosed. The method 600 initiates at 602 for sensing a physical parameter by supplying a process stable voltage to a first sensor element or first sensor. At 604, a signal is detected having a first state of the physical parameter. For example, a first sensor or sensor element detects a first state of the physical parameter (e.g., a magnetic field or the like) in response to a first sensor current. At 606, a first sensor current is provided at the first sensor element.

At 608, the method 600 further comprises generating a second sensor current based on the first sensor current. At

610, the second sensor is provided a second sensor current. At 612, another signal is detected as having a second state and the first state of the physical parameter.

In addition, the method comprises feeding back, via a feedback loop or a regulation loop, a feedback voltage at the first sensor element to an amplifier, or a bandgap reference circuit, of the voltage source component, and generating the process stable voltage based on the feedback voltage. A differential signal output is then generated based on the first state and the second state of the signal detected by the sensor elements, or a first and second sensor, of the physical parameter. The sensor, sensor element or sensors can be resistive sensors, or the like, as discussed above. As an alternative a single ended output signal may be generated from the second sensor current based on the first sensor current in the step 608.

In another embodiment, the method can include detecting an offset or mismatch between the first sensor/element and the second sensor/element. A unity of a current mirror circuit can be programmably or selectively segmented with a number of current mirror circuits coupled together to reduce the offset or mismatch. The regulation loop can be configured into an open loop configuration, and a current supply component can be powered down or deactivated via a power down switch to independently test the first sensor and the second sensor. The method can further include applying a current to the first sensor element or the second sensor element via the current mirror circuit, and generating a determination of a sensor parameter of at least one of the first sensor element or the second sensor element; and modifying the sensor parameter based on the determination.

Although the disclosure has been shown and described with respect to one or more implementations, equivalent alterations and modifications will occur to others skilled in the art based upon a reading and understanding of this specification and the annexed drawings. Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A sensor system for differentially sensing a physical parameter comprising:
   a sensor component comprising a first sensor configured to generate a first signal in response to a first state of the physical parameter, and a second sensor configured to generate a second signal in response to a second state of the physical parameter;
   a voltage source component configured to generate a process stable voltage to drive the first sensor; and
   a current supply component configured to provide a first supply signal to the first sensor, detect a first sensor current through the first sensor and the first state of the physical parameter, and provide a second sensor current to the second sensor based on the first sensor current through the first sensor and the first state of the physical parameter, wherein the second sensor is further configured to output the second signal with the first state and the second state of the physical parameter.

2. The sensor system of claim 1, wherein the current supply component comprises a current mirror circuit that includes one or more transistors configured to detect the first sensor current through the first sensor, replicate the first sensor current and provide the second sensor current to the second sensor based on the first sensor current and the first state of the physical parameter, and the second sensor is further configured to provide the second signal as a single ended signal with the first state and the second state of the physical parameter to an output.

3. The sensor system of claim 1, further comprising:
   a current sensor configured to detect the first sensor current through the first sensor based on the process stable voltage from the voltage source component and the first signal in response to the physical parameter.

4. The sensor system of claim 1, wherein the current supply component is further configured to provide a supply voltage to the second sensor that is based on the second sensor current being generated from the process stable voltage and the first signal of the physical parameter.

5. The sensor system of claim 4, wherein the sensor component is further configured to eliminate a process variation by generating a differential sensor signal that is proportional to the process stable voltage and based on the first signal and the second signal.

6. The sensor system of claim 1, further comprising:
   a regulation loop configured to provide a process stable and regulated voltage that drives the first sensor.

7. The sensor system of claim 6, wherein the current supply component comprises:
   a current mirror component comprising a first current mirror transistor coupled within the regulation loop to provide the first sensor current to the first sensor through a first output of the current supply component, and a second mirror transistor coupled outside of the regulation loop to provide the second sensor current through a second output of the current supply component to the second sensor based on the first sensor current.

8. The sensor system of claim 1, wherein the current supply component comprises:
   a first transistor configured as a current mirror input;
   a second transistor coupled to the first transistor at control terminals respectively and configured as a first current mirror output, in order to generate the first sensor current to the first sensor via a first supply terminal based on a current signal from the first transistor; and
   a third transistor coupled to the second transistor and the first transistor at the control terminals, and configured as a second current mirror output, in order to replicate the first sensor current and provide a replicated current as the second sensor current to the second sensor via a second supply terminal.

9. The sensor system of claim 8, further comprising:
a chopping component configured to chop an output contact of the second transistor with another output contact of the third transistor to reduce a low frequency noise.

10. The sensor system of claim 1, wherein the voltage source component comprises a differential amplifier, or a bandgap reference circuit, configured to generate the process stable voltage.

11. The sensor system of claim 1, further comprising:
a matching component configured to reduce or eliminate an offset caused by a resistance mismatch between the first sensor and the second sensor by activating or deactivating one or more current mirror components configured to replicate the first sensor current and provide a replicated current as the second sensor current to the second sensor.

12. The sensor system of claim 1, further comprising:
a testing component configured to individually and independently generate a test of a sensor parameter of the first sensor and the second sensor in isolation from one another by generating an open loop configuration to deactivate a feedback loop and the voltage source component via one or more switches, independently provide a current to the first sensor and the second sensor via the current supply component, and independently calibrate the sensor parameter of the first sensor and the second sensor based on the test.

13. A sensor device comprising:
a first sensor configured to sense a first quantity of a physical parameter;
a second sensor configured to sense a second quantity of the physical parameter;
a voltage source component coupled to the first sensor and configured to generate a process stable voltage through the first sensor; and
a current supply component configured to sense a first sensor current through the first sensor based on the first quantity of the physical parameter and the process stable voltage, and provide a second sensor current through the second sensor, based on the first sensor current and the first state of the physical parameter, wherein the second sensor is further configured to output the second signal with the first state and the second state of the physical parameter.

14. The sensor device of claim 13, wherein the current supply component comprises a current mirror circuit configured to detect the first sensor current through the first sensor and replicate the first sensor current to provide the second sensor current to the second sensor based on the first sensor current and the first quantity of the physical parameter, wherein the second sensor is further configured to provide a single ended signal to an output comprising the first quantity and the second quantity of the physical parameter based on the second sensor current.

15. The sensor device of claim 13, wherein the current supply component comprises a current mirror circuit comprising:
a first transistor comprising a first input contact, a first control contact and a first output contact;
a second transistor comprising a second input contact, a second control contact and a second output contact; and
a third transistor comprising a third input contact, a third control contact and a third output contact;
wherein the first input contact, the second input contact and the third input contact are coupled to one another to receive a supply voltage;
wherein the first control contact, the second control contact and the third control contact are coupled to one another;
wherein the first output contact is coupled to the voltage source component and to the first control contact, the second output contact is coupled to the first sensor, and the third output contact is coupled to the second sensor.

16. The sensor device of claim 13, wherein the voltage source component comprises an amplifier, or a bandgap reference circuit, configured to provide a control current to a current mirror circuit of the current supply component, and generate the process stable voltage as a constant voltage to the first sensor via a feedback loop.

17. The sensor device of claim 16, wherein the amplifier is configured to receive a feedback voltage via the feedback loop and a process stable reference voltage to generate the process stable voltage.

18. The sensor device of claim 13, further comprising:
a matching component configured to reduce an offset caused by a mismatch between the first sensor and the second sensor by modifying a number of current mirror components coupled to one another as a part of the current supply component, wherein the number of current mirror components is configured to replicate the first sensor current and provide a replicated current as the second sensor current to the second sensor.

19. The sensor device of claim 13, further comprising:
a testing component comprising one or more power down switches configured to deactivate the current supply component, provide an external test current to the first sensor and the second sensor, and directly measure a voltage of the first sensor and the second sensor, in order to characterize a resistive behavior of the first sensor and the second sensor.

20. The sensor device of claim 13, further comprising:
a current sensor of the current supply component configured to detect the first sensor current through the first sensor based on the first quantity sensed by the physical parameter and the process stable voltage; and
a current mirror element configured to generate a replicated current of the first sensor current and provide the replicated current to the second sensor to generate a differential sensor signal of the physical parameter.

21. A method for sensing a physical parameter comprising:
supplying a process stable voltage to a first sensor element of a sensor;
detecting a signal having a first state of the physical parameter;
detecting a first sensor current through the first sensor element;
generating a second sensor current based on the first sensor current and the first state of the physical parameter;
providing the second sensor current to a second sensor element of the sensor;
detecting another signal having a second state of the physical parameter; and
outputting the another signal as a single ended signal having the first state of the physical parameter and the second state of the physical parameter.

22. The method of claim 21, further comprising:
feeding back, via a regulation loop, a feedback voltage of the first sensor element to an amplifier, or a bandgap reference circuit, of a voltage source component; and
generating the process stable voltage based on an amplification of the feedback voltage.

23. The method of claim 22, further comprising;
facilitating the regulation loop into an open loop configuration;
deactivating a current supply component via a power down switch to independently test the first sensor element and the second sensor element;
applying a current to the first sensor element or the second sensor element via a current mirror circuit;
generating a determination of a sensor parameter of at least one of the first sensor element or the second sensor element; and
modifying the sensor parameter based on the determination.

24. The method of claim 21, further comprising:
generating a differential signal output based on the first state and the second state detected by the sensor of the physical parameter, wherein the sensor is a resistive sensor.

25. The method of claim 21, further comprising:
detecting an offset between the first sensor element and the second sensor element; and
segmenting a unity of a current mirror circuit configured to replicate the first sensor current with a number of current mirror circuits coupled together to reduce the offset.

* * * * *